(12) United States Patent
Hsieh et al.

(10) Patent No.: US 7,170,301 B1
(45) Date of Patent: Jan. 30, 2007

(54) TOUCH SENSING APPARATUS

(75) Inventors: Kuan-Hong Hsieh, Guangdong (CN);
Shin-Hong Chung, Guangdong (CN);
Han-Che Wang, Guangdong (CN);
Shi-Quan Lin, Guangdong (CN)

(73) Assignee: Hong Fu Jin Precision Industry (Shen Zhen) Co., Ltd., Shenzhen (CN)

( * ) Notice: Subject to any disclaimer, the term of this patent is extended or adjusted under 35 U.S.C. 154(b) by 0 days.

(21) Appl. No.: 11/308,892

(22) Filed: May 23, 2006

(30) Foreign Application Priority Data

Aug. 12, 2005 (CN) .................. 2005 1 0036577

(51) Int. Cl.
*G01R 27/26* (2006.01)
*H03K 17/96* (2006.01)
*H03K 17/955* (2006.01)

(52) U.S. Cl. .................. 324/663; 324/686; 341/33
(58) Field of Classification Search ............. 324/663, 324/686; 341/33
See application file for complete search history.

(56) References Cited

U.S. PATENT DOCUMENTS

| | | | |
|---|---|---|---|
| 4,289,980 A * | 9/1981 | McLaughlin | ............... 307/116 |
| 5,495,077 A | 2/1996 | Miller et al. | |
| 5,783,875 A * | 7/1998 | Jaros | ............... 307/116 |
| 6,534,970 B1 | 3/2003 | Ely et al. | |
| 6,545,614 B1 | 4/2003 | Kasai | |
| 2003/0030570 A1* | 2/2003 | Netzer | ............... 340/870.37 |

* cited by examiner

Primary Examiner—Andrew H. Hirshfeld
Assistant Examiner—Amy He
(74) Attorney, Agent, or Firm—Winston Hsu

(57) ABSTRACT

A touch sensing apparatus includes a signal source for generating an alternating current signal, a conductor connected to the signal source, a sensor for receiving a noise generated by a contact of an object. The sensor together with the conductor form a simulated capacitor that results in alternating current signal flowing through the sensor when the sensor is contacted by the object. A detector has a first input end and a second input end. The detector results in voltage differences between the first and second input ends thereof when receiving the alternating current signal output from the sensor, and thus output a signal. A rectifying circuit is used for rectifying the alternating current signal generated by the signal source and simultaneously generating a noise. One end of the rectifier circuit is connected to the signal source and other end of the rectifier circuit is connected to the negative power input end of the detector.

4 Claims, 1 Drawing Sheet

TOUCH SENSING APPARATUS

FIELD OF THE INVENTION

The present invention relates generally to touch sensing apparatuses such as those used in certain personal computers, and particularly to a touch sensing apparatus for sensing a noise generated by a user's touch.

DESCRIPTION OF RELATED ART

There are several available touch-sensing technologies that may be employed for use as a positional indicator in an apparatus such as a personal computer. Resistive-membrane positioning sensors are known and used in several applications. However, these sensors generally have poor resolutions. In addition, the sensors surface is exposed and thus subject to wear and tear. Furthermore, resistive-membrane touch sensors are relatively expensive. A one-surface sensor configuration requires a user to be grounded for reliable operation. This cannot be assumed when using devices such as portable computers. An example of a one-surface sensor configuration is the UnMouse product available from Micro-Touch, of Wilmington, Ma.

A touch sensitive control device translates touched locations into output signals. The device includes a substrate which supports a first and second interleaved, closely spaced, non-overlapping arrays of conductive plates. An insulating layer overlies the first and second arrays so that when the outer surface of the insulating layer is touched, the capacitance of at least one of the columns of plates of the first array and the rows of plates of the second array underlying the insulating layer at the location being touched exhibits a change of capacitance with respect to ambient ground. Based upon the measured capacitance of each column of the first array and row of the second array, the microcomputer produces output signals representing the coordinates of the location being touched. These output signals can be used, for example, to control the position of a cursor on a display screen of a personal computer or to make selected function commands.

In a second kind of conventional apparatus, a tablet for sensing the position of a stylus is provided. The stylus alters the transcapacitance coupling between row and column electrodes, which are scanned sequentially. In a third kind of conventional apparatus, a radial electrode arrangement is provided adjacent the space bar of a keyboard. The radial electrode arrangement is part of a trackball system, and can be activated by a user touching the trackball with his/her thumb. This third kind of apparatus teaches the use of total touch capacitance as an indication of the touch pressure, in order to control the velocity of motion of a display screen cursor. Pulsed sequential polling is employed to address the effects of electrical interference.

What is still needed is a touch sensing apparatus with reduced circuitry complexity, low power consumption, improved sense accuracy, improved efficiency, and lower manufacturing costs.

SUMMARY OF INVENTION

A touch sensing apparatus is provided. A preferred embodiment of a touch sensing apparatus includes a signal source, a conductor, a sensor, a detector, and a rectifier circuit. Wherein the signal source is for generating an alternating current signal. A conductor is connected to the signal source. A sensor is for receiving a noise generated by a contact of an object. Wherein the sensor and the conductor form a simulated capacitor that results in alternating current signal flowing through the sensor when the sensor is contacted by the object. A detector having a first input end and a second input end, the detector upon receiving the alternating current signal output from the sensor resulting in voltage differences between the first and second input ends thereof, and outputting a signal. A rectifying circuit for rectifying the alternating current signal generated by the signal source and simultaneously generating a noise; wherein one end of the rectifier circuit is connected to the signal source and the other end of the rectifier circuit is connected to the negative power input end of the detector.

Other advantages and novel features will be drawn from the following detailed description of the preferred embodiment with reference to the attached drawings, in which:

DETAILED DESCRIPTION

Figure 1:
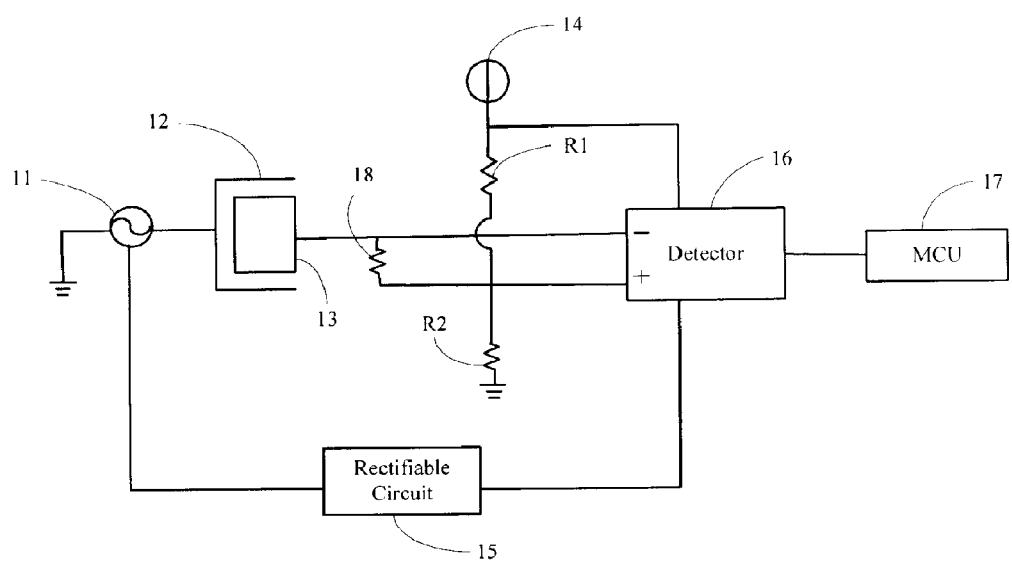
FIG. 1 is an exemplary circuit diagram of a touching sensing apparatus in accordance with a preferred embodiment of the present invention.

FIG. 1 is an exemplary circuit diagram of a touching sensing apparatus. The circuit mainly includes a signal source 11, a conductor 12, a sensor 13, a direct current power source 14, a rectifying circuit 15, a detector 16, a microcontroller unit (MCU) 17, and a load circuit 18. The signal source 11 is connected to the conductor 12. The conductor 12 partially encloses the sensor 13, and forms a simulated capacitor with the sensor 13. The sensor 13 is connected to a first input end (symbolically labeled as "−") of the detector 16. The direct current power source 14 is connected to a second input end (symbolically labeled as "+") of detector 16 by a first resistance R1 and provides a biased voltage for the detector 16. The direct current power source 14 is also connected in parallel to the positive power input end of the detector 16 and provides positive power source for the detector 16. One end of the first resistance R1 connects to the direct current power source 14. The other end of the first resistance R1, as well as one end of a resistance R2, is connected to the second input end of the detector 16. The other end of the resistance R2 is grounded. Utilizing the first and second resistances R1 and R2, a voltage of the first input end of the detector 16 is designed to be equal to a voltage of the second input end of the detector 16, thereby obtaining a balance state of the circuit, namely there is no signal flowing from the detector. During balance state, voltages of the first input end and the second input end of the detector 16 are the relatively the same. One end of the rectifying circuit 15 is connected to the signal source 11 and the other end of the rectifying circuit 15 is connected to a negative power input end of the detector 16. The MCU 17 is connected to an output end of the detector 16. The load circuit 18 connects the first and second input ends of the detector 16. In this embodiment, the load circuit 18 could be a resistor The signal source 11 is for generating an alternating current signal. The circuit is in a balance state when no object is in contact with the sensor 13. The object is itself electrically conductive with a noise. Therefore, when any object touches the sensor 13, noise flows to the sensor 13 at the same time a dielectric constant between the conductor 12 and the sensor 13 is increased. Due to the noise and the increased dielectric constant, the capacitance of the simulated capacitor is increased. Consequently, the alternating current signal from the signal source 11 flows through the senor 13, simultaneously, the voltage of the first input end of the detector 16 becomes greater than the voltage of the second input end of the detector 16, as a result, the circuit enters an unbalanced state. In the unbalanced state, the detector 16 generates and amplifies a signal to the MCU 17 to perform a corresponding control. The detector 16 has a high input impedance, so as to easily detect the signal received from the input ends of the detector 16. The rectifying circuit 15 rectifies the alternating current signal generated by the signal source 11 as a negative power source for the detector 16 and generates noise simultaneously. The noise acts on all peripheral environment, consequently, the overall noise of the object increased also. When any object touches the sensor 13 the noise flowing to the sensor 13 is increased, thereby obtaining an accurate sensitivity. When the sensor 13 is touched, the load circuit 18, the object, and the ground form a loop circuit, improving the sensitivity of the sensor 13.

Although the present invention has been specifically described on the basis of a preferred embodiment, the invention is not to be construed as being limited thereto. Various changes or modifications may be made to the embodiment without departing from the scope and spirit of the invention.

What is claimed is:

1. A touch sensing apparatus comprising:
    a signal source for generating an alternating current signal;
    a conductor connected to the signal source;
    a sensor for receiving a noise generated by a contact of an object;
    wherein the sensor and the conductor form a simulated capacitor that results in alternating current signal flowing through the sensor when the sensor is contacted by the object;
    a detector having a first input end and a second input end, the detector upon receiving the alternating current signal output from the sensor resulting in voltage differences between the first and second input ends thereof, and outputting a signal; and
    a rectifying circuit for rectifying the alternating current signal generated by the signal source and simultaneously generating a noise;
    wherein one end of the rectifier circuit is connected to the signal source and the other end of the rectifier circuit is connected to the negative power input end of the detector; and
    a direct current power source, wherein the direct current power source is electrically connected to the second input end and a positive power input end of the detector, and provides a bias voltage for the detector.

2. The touch sensing apparatus as described in claim 1, further comprising a resistance element connected between the first input end and the second input end of the detector.

3. The touch sensing apparatus as described in claim 1, further comprising a microcontroller unit (MCU) for processing the signal outputted by the detector.

4. The touch sensing apparatus as described in claim 1, wherein the detector comprises a relatively high input impedance.

* * * * *

UNITED STATES PATENT AND TRADEMARK OFFICE
CERTIFICATE OF CORRECTION

PATENT NO. : 7,170,301 B1 Page 1 of 1
APPLICATION NO. : 11/308892
DATED : January 30, 2007
INVENTOR(S) : Kuan-Hong Hsieh et al.

It is certified that error appears in the above-identified patent and that said Letters Patent is hereby corrected as shown below:

And on the title page item (30), correct the Foreign Application Priority Data from "Aug. 12, 2005 (CN)................200510036577"
to --Aug. 12, 2005 (CN).................200510036577.9--.

Signed and Sealed this

Seventeenth Day of April, 2007

JON W. DUDAS
*Director of the United States Patent and Trademark Office*

UNITED STATES PATENT AND TRADEMARK OFFICE
CERTIFICATE OF CORRECTION

PATENT NO. : 7,170,301 B1
APPLICATION NO. : 11/308892
DATED : January 30, 2007
INVENTOR(S) : Kuan-Hong Hsieh et al.

It is certified that error appears in the above-identified patent and that said Letters Patent is hereby corrected as shown below:

On the title page item (73), correct the assignee from

"HONG FU JIN PRECISION INDUSTRY (Shen Zhen) CO., LTD., Shenzhen"
to
    --HONG FU JIN PRECISION INDUSTRY (Shen Zhen) CO., LTD., Shenzhen
      HON HAI PRECISION INDUSTRY CO., LTD., Taipei Hsien-- and on the title page item (30), correct the Foreign Application Priority Data from "Aug. 12, 2005 (CN)....................200510036577"
to
    --Aug. 12, 2005 (CN)....................200510036577.9--.

Signed and Sealed this

Fourth Day of December, 2007

JON W. DUDAS
*Director of the United States Patent and Trademark Office*